(12) United States Patent
Tsou et al.

(10) Patent No.: US 11,614,486 B2
(45) Date of Patent: Mar. 28, 2023

(54) TESTKEY AND TESTING SYSTEM WHICH REDUCE LEAKAGE CURRENT

(71) Applicant: UNITED MICROELECTRONICS CORP., Hsin-Chu (TW)

(72) Inventors: Po-Wei Tsou, Taoyuan (TW); Chang-Ting Lo, New Taipei (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 35 days.

(21) Appl. No.: 17/406,084

(22) Filed: Aug. 19, 2021

(65) Prior Publication Data

US 2023/0020783 A1    Jan. 19, 2023

(30) Foreign Application Priority Data

Jul. 19, 2021  (TW) .................................. 110126371

(51) Int. Cl.
  *G01R 31/3185*  (2006.01)
  *G01R 31/319*  (2006.01)
  *G01R 22/00*  (2006.01)
(52) U.S. Cl.
  CPC ................ *G01R 31/318511* (2013.01); *G01R 31/31905* (2013.01)
(58) Field of Classification Search
  CPC .. H01L 22/34; G01R 31/2601; G01R 31/2621
  See application file for complete search history.

(56) References Cited

U.S. PATENT DOCUMENTS

| | | | | |
|---|---|---|---|---|
| 2009/0066359 | A1* | 3/2009 | Smith | G01R 31/2601 324/762.08 |
| 2010/0315115 | A1* | 12/2010 | Lee | H01L 29/4908 324/762.01 |
| 2017/0059645 | A1* | 3/2017 | Pan | G01R 31/2607 |
| 2020/0341059 | A1* | 10/2020 | van der Wagt | G05F 1/56 |

* cited by examiner

*Primary Examiner* — Jermele M Hollington
*Assistant Examiner* — Temilade S Rhodes-Vivour
(74) *Attorney, Agent, or Firm* — Winston Hsu

(57) ABSTRACT

A testkey includes two switching circuits and two compensation circuits. The first switching circuit transmits a test signal to a first DUT when the first DUT is being tested and functions as high impedance when the first DUT is not being tested. The second switching circuit transmits the test signal to a second DUT when the second DUT is being tested and functions as high impedance when the second DUT is not being tested. When the first DUT is not being tested and the second DUT is being tested, the first compensation circuit provides first compensation current for reducing the leakage current of the first switching circuit. When the first DUT is being tested and the second DUT is not being tested, the second compensation circuit provides second compensation current for reducing the leakage current of the second switching circuit.

9 Claims, 2 Drawing Sheets

TESTKEY AND TESTING SYSTEM WHICH REDUCE LEAKAGE CURRENT

CROSS REFERENCE TO RELATED APPLICATION

This application claims priority of Taiwan Application No. 110126371 filed on 2021 Jul. 19.

BACKGROUND OF THE INVENTION

1. Field of the Invention

The present invention is related to a testkey and a testing system, and more particularly, to a testkey and a testing system which reduce leakage current.

2. Description of the Prior Art

In semiconductor fabrication, semiconductor devices or integrated circuits (ICs) are continuously tested in every step so as to maintain device quality. In the most widely adopted wafer acceptance testing (WAT) method, testkeys are fabricated in a scribe line of a wafer or on a monitor wafer simultaneously with the forming of actual or functional devices in the product wafer so that the fabricating processes are stimulated and the quality of the actual devices are checked. The testkeys are usually designed for different types of device under test (DUT). These DUTs may include fundamental devices, such as transistors, resistors and capacitors. The electrical characteristics of the DUTs may be measured for verifying the manufacturing process.

In the prior art WAT method, a testkey with addressable transistor arrays may be used to measure a large quantity of transistors within a limited space by using a common test pad shared by all transistors based on the addressing technique, instead of measuring each DUT via its corresponding test pad. However, a DUT may generate sub-threshold leakage current when not being tested. Since the DUTs not being tested are normally the majority, the sum of all sub-threshold leakage current may influence the test accuracy of a DUT being tested.

SUMMARY OF THE INVENTION

The present invention provides a testkey with reduced leakage current. The testkey includes a first switching circuit, a second switching circuit, a first compensation circuit and a second compensation circuit. The first switching circuit is coupled between a test signal and a first DUT and configured to transmit the test signal to the first DUT when the first DUT is being tested and function as high impedance when the first DUT is not being tested. The second switching circuit is coupled between the test signal and a second DUT and configured to transmit the test signal to the second DUT when the second DUT is being tested and function as high impedance when the second DUT is not being tested. The first compensation circuit is coupled to the first switching circuit and configured to provide first compensation current for reducing leakage current of the first switching circuit when the first DUT is not being tested and the second DUT is being tested. The second compensation circuit is coupled to the second switching circuit and configured to provide second compensation current for reducing leakage current of the second switching circuit when the second DUT is not being tested and the first DUT is being tested.

The present invention also provides a test system which includes an input circuit configured to provide a test signal, a first through an $N^{th}$ DUTs wherein N is an integer larger than 1, and a test key. The testkey includes a first through an $N^{th}$ switching circuits coupled between the input circuit and the first through the $N^{th}$ DUTs, respectively, and a first through an $N^{th}$ compensation circuits coupled to the first through the $N^{th}$ DUTs, respectively. An $n^{th}$ switching circuit among the first through the $N^{th}$ switching circuits is configured to transmit the test signal to the an $n^{th}$ DUT among the first through the $N^{th}$ DUTs when the $n^{th}$ DUT is being tested, wherein n is an integer between 1 and N. The $n^{th}$ switching circuit is configured to function as high impedance when the $n^{th}$ DUT is not being tested. The $n^{th}$ compensation circuit among the first through the $N^{th}$ compensation circuits is configured to provide $n^{th}$ compensation current for reducing leakage current of the $n^{th}$ switching circuit when the $n^{th}$ DUT is not being tested.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
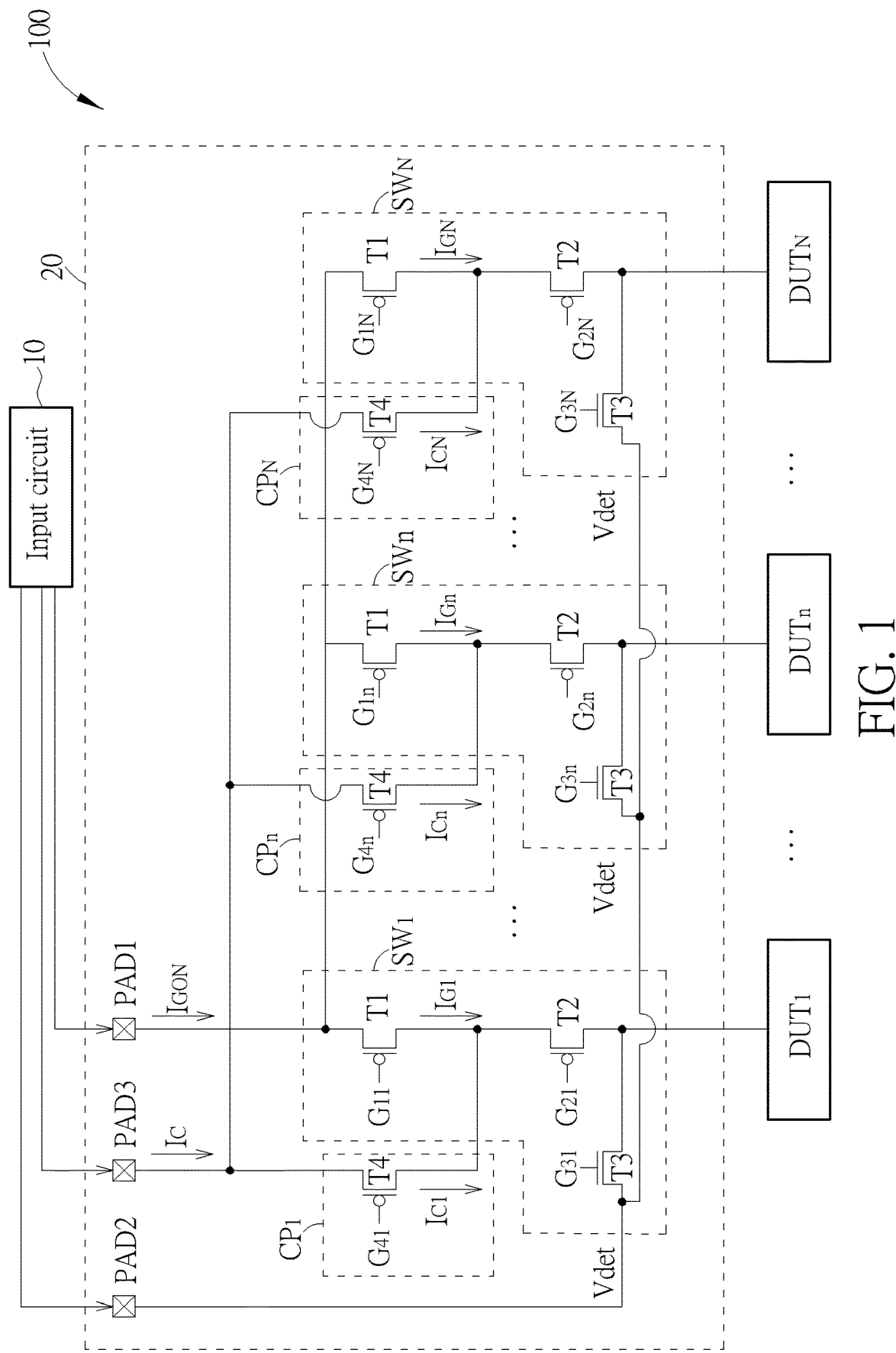
FIG. 1 is a diagram illustrating a test system according to an embodiment of the present invention.
Figure 2:
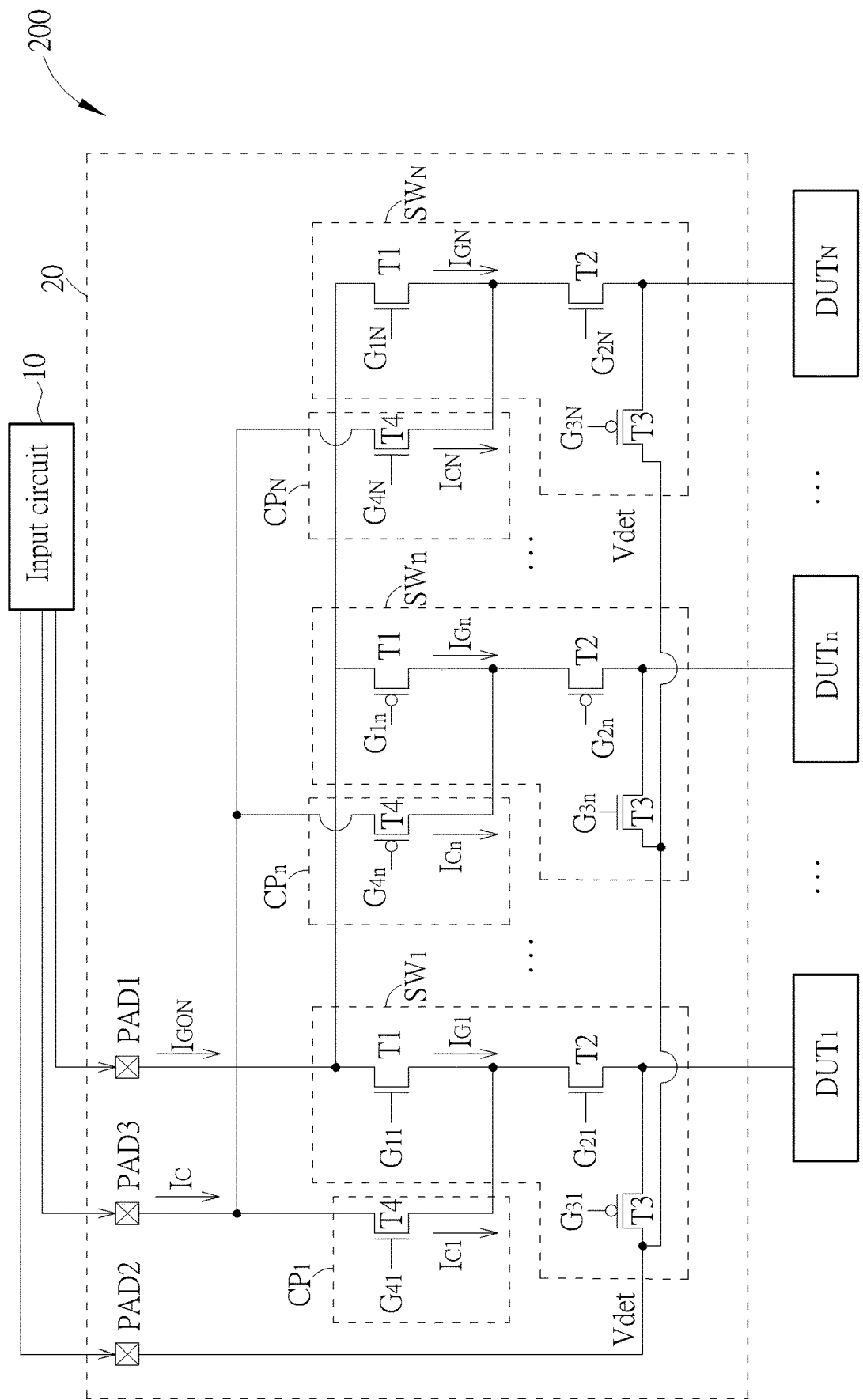
FIG. 2 is a diagram illustrating a test system according to another embodiment of the present invention.

FIG. 1 is a diagram illustrating a test system 100 according to an embodiment of the present invention. FIG. 2 is a diagram illustrating a test system 200 according to another embodiment of the present invention. Each of the test systems 100 and 200 includes an input circuit 10, a testkey 20, and N devices under test $DUT1$-$DUT_N$, wherein N is an integer larger than 1. The input circuit 10 is configured to provide a test signal $I_{GON}$, a compensation signal $I_C$, and a predetermined voltage Vdet. The testkey 20 includes N switching circuits $SW_1$-$SW_N$, N compensation circuits $CP_1$-$CP_N$, and test pads PAD1-PAD3. The testkey 20 is configured to selectively transmit the test signal $I_{GON}$ to the N devices under test $DUT1$-$DUT_N$ for measuring related parameters, and selectively transmit the compensation signal $I_C$ to the N switching circuits $SW_1$-$SW_N$ for reducing leakage current. $I_{G1}$-$I_{GN}$ represent the current flowing through the N switching circuits $SW_1$-$SW_N$, respectively. $I_{C1}$-$I_{CN}$ represent the current flowing through the N compensation circuits $CP_1$-$CP_N$, respectively.

In an embodiment of the present invention, each of the N devices under test $DUT_1$-$DUT_N$ may include a transistor, such as a metal oxide semiconductor field-effect transistor (FET), a bipolar transistor (BJT), or any type of transistor. The N devices under test $DUT_1$-$DUT_N$ may have different physical characteristics, such as different gate widths, gate lengths, doping concentrations or doping types. However, the type of transistors included in the N devices under test $DUT_1$-$DUT_N$ does not limit the scope of the present invention.

In the test systems 100 and 200 of the present invention, a switching circuit $SW_n$ among the N switching circuits $SW_1$-$SW_N$ is coupled to the test pad PAD1, the test pad PAD2, and a corresponding device under test $DUT_n$ among the N devices under test $DUT_1$-$DUT_N$, wherein n is an integer between 1 and N. A compensation circuit $CP_n$ among the N compensation circuits $CP_1$-$CP_N$ is coupled to the test pad PAD3 and the corresponding switching circuit $SW_n$. The testkey 20 is configured to receive the test signal $I_{GON}$ via the test pad PAD1, receive the predetermined voltage Vdet via the test pad PAD2, and receive the compensation signal $I_C$ via the test pad PAD3. The corresponding switching circuit $SW_n$ is configured to selectively transmit the test signal $I_{GON}$ to the device under test $DUT_n$ according to switching signals $G_{1n}$ and $G_{2n}$, selectively bias a node between the device under test $DUT_n$ and the switching circuit $SW_n$ to the predetermined voltage Vdet according to a switching signal $G_{3n}$. The compensation circuit $CP_n$ is configured to provide compensation current $I_{Cn}$ according to a switching signal $G_{4n}$ which is associated with the test status of the device under test $DUT_n$.

In the test systems 100 and 200 of the present invention, each switching circuit of the N switching circuits $SW_1$-$SW_N$ includes switches T1-T3, and each compensation circuit of the N compensation circuits $CP_1$-$CP_N$ includes a transistor T4. For illustrative purpose, the switching circuit $SW_n$ and the compensation circuit $CP_n$ are used to explain the present invention. The switch T1 includes a first end coupled to the test pad PAD1, a second end, and a control end coupled to the switching signal $G_{1n}$. The switch T2 includes a first end coupled to the second end of the switch T1, a second end coupled to the device under test $DUT_n$, and a control end coupled to the switching signal $G_{2n}$. The switch T3 includes a first end coupled to the second end of the switch T2, a second end coupled to the test pad PAD3, and a control end coupled to the switching signal $G_{3n}$. The switch T4 includes a first end coupled to the test pad PAD3, a second end coupled between the second end of the switch T1 and the first end of the switch T2, and a control end coupled to the switching signal $G_{4n}$.

When the device under test $DUT_n$ is being tested, the switches T1 and T2 of the switching circuit $SW_n$ are turned on by the switching signals $G_{1n}$ and $G_{2n}$ having an enable level, thereby transmitting the test signal $I_{GON}$ to the device under test $DUT_n$. In other words, the current $I_{Gn}$ flowing through the switches T1 and T2 is not zero. Meanwhile, the switch T3 of the switching circuit $SW_n$ and the switch T4 of the compensation circuit $CP_n$ are turned off (the compensation current $I_{Cn}$ flowing through the switch T4 is zero) by the switching signals $G_{3n}$ and $G_{4n}$ having a disable level, thereby maintaining the test signal path between the test pad PAD1 and the device under test $DUT_n$.

When the device under test $DUT_n$ is not being tested, the switches T1 and T2 of the switching circuit $SW_n$ are turned off by the switching signals $G_{1n}$ and $G_{2n}$ having the disable level, thereby cutting off the test signal path between the test pad PAD1 and the device under test $DUT_n$. Meanwhile, the switch T3 of the switching circuit $SW_n$ is turned on by the switching signal $G_{3n}$ having the enable level, thereby biasing the node between the device under test $DUT_n$ and the switching circuit $SW_n$ to the predetermined voltage Vdet for reducing coupling effect. Also, the switch T4 of the compensation circuit $CP_n$ is turned on by the switching signal $G_{4n}$ having the enable level, thereby providing the compensation current $I_{Cn}$ ($I_{Cn} \neq 0$) for reducing the leakage current of the switches T1 and T2.

In the test system 100 depicted in FIG. 1, the devices under test $DUT_1$-$DUT_N$ are N-type transistors, and the switches T1 and T2 in the switching circuits $SW_1$-$SW_N$ and the switches T4 in the compensation circuits $CP_1$-$CP_N$ are P-type transistors. In the test system 200 depicted in FIG. 2, the devices under test $DUT_1$-$DUT_N$ are P-type transistors, and the switches T1 and T2 in the switching circuits $SW_1$-$SW_N$ and the switches T4 in the compensation circuits $CP_1$-$CP_N$ are N-type transistors. In another embodiment, the device under test $DUT_1$ is an N-type transistor, the device under test $DUT_2$ is a P-type transistor, the switches T1 and T2 in the switching circuit $SW_1$ and the switch T4 in the compensation circuit $CP_1$ are P-type transistors, and the switches T1 and T2 in the switching circuit $SW_2$ and the switch T4 in the compensation circuit $CP_2$ are N-type transistors. For an N-type transistor, the enable level is logic 1 and the disable level is logic 0; for a P-type transistor, the enable level is logic 0 and the disable level is logic 1.

In an embodiment, the switch T1 in the switching circuit $SW_n$ and the switch T4 in the compensation circuit $CP_n$ are transistors having the same W/L ratio. In another embodiment, the size of the switch T4 in the compensation circuit $CP_n$ may be determined based on the leakage current of the switches T1 and T2 in the switching circuit $SW_n$ when in the cut-off state. However, the size of the switch T4 in the compensation circuit $CP_n$ does not limit the scope of the present invention.

In conclusion, in the testkey and the test system of the present invention, the switching circuit may test multiple DUTs using addressing method, and the compensation circuit may provide corresponding compensation current according to the test status of the DUT. Therefore, the present invention can reduce test space and leakage current, thereby improving test accuracy.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A testkey with reduced leakage current, comprising:
  a first switching circuit coupled between a test signal and a first device under test (DUT) and configured to transmit the test signal to the first DUT when the first DUT is being tested and function as high impedance when the first DUT is not being tested, the first switching circuit comprising:
    a first switch including:
      a first end coupled to a first test pad;
      a second end; and
      a control end coupled to a first switching signal; and
    a second switch including:
      a first end coupled to the second end of the first switch;
      a second end coupled to the first DUT; and
      a control end coupled to a second switching signal;
  a second switching circuit coupled between the test signal and a second DUT and configured to transmit the test signal to the second DUT when the second DUT is being tested and function as high impedance when the second DUT is not being tested, the second switching circuit comprising:
    a third switch including:
      a first end coupled to the first test pad;
      a second end; and
      a control end coupled to a third switching signal; and
    a fourth switch including:
      a first end coupled to the second end of the third switch;
      a second end coupled to the second DUT; and
      a control end coupled to a fourth switching signal;

a first compensation circuit coupled to the first switching circuit and configured to provide first compensation current for reducing leakage current of the first switching circuit when the first DUT is not being tested and the second DUT is being tested; and a second compensation circuit coupled to the second switching circuit and configured to provide second compensation current for reducing leakage current of the second switching circuit when the second DUT is not being tested and the first DUT is being tested.

2. The testkey of claim 1, wherein:
the first switching circuit further comprises:
  a fifth switch including:
    a first end coupled to a second test pad;
    a second end coupled to the second end of the second switch; and
    a control end coupled to a fifth switching signal; and
the second switching circuit further comprises:
  a sixth switch including:
    a first end coupled to the second test pad;
    a second end coupled to the second end of the fourth switch; and
    a control end coupled to a sixth switching signal.

3. The testkey of claim 1, wherein:
the first compensation circuit comprises an eighth switch which includes:
  a first end coupled to a third test pad;
  a second end coupled to the second end of the first switch and the first end of the second switch; and
  a control end coupled to an eighth switching signal; and
the second compensation circuit comprises a ninth switch which includes:
  a first end coupled to the third test pad;
  a second end coupled to the second end of the third switch and the first end of the fourth switch; and
  a control end coupled to a ninth switching signal.

4. The testkey of claim 1, wherein:
the first DUT, the second DUT and the first through the fourth switches are transistors;
the first through the fourth switches have a first doping type; and
the first DUT and the second DUT have a second doping type which is different from the first doping type.

5. The testkey of claim 1, wherein:
the first DUT is an N-type transistor;
the second DUT is a P-type transistor;
the first switch and the second switch are P-type devices; and
the third switch and the fourth switch are N-type devices.

6. A test system, comprising:
an input circuit configured to provide a test signal;
a first through an $N^{th}$ DUTs, wherein N is an integer larger than 1; and
a testkey comprising:
  a first through an $N^{th}$ switching circuits coupled between the input circuit and the first through the $N^{th}$ DUTs, respectively; and
  a first through an $N^{th}$ compensation circuits coupled to the first through the $N^{th}$ DUTs, respectively, wherein:
    an $n^{th}$ switching circuit among the first through the $N^{th}$ switching circuits is configured to transmit the test signal to the an $n^{th}$ DUT among the first through the $N^{th}$ DUTs when the $n^{th}$ DUT is being tested;
    the $n^{th}$ switching circuit is configured to function as high impedance when the $n^{th}$ DUT is not being tested;
    the $n^{th}$ switching circuit comprises:
      a first switch including:
        a first end coupled to a first test pad;
        a second end; and
        a control end coupled to a first switching signal; and
      a second switch including:
        a first end coupled to the second end of the first switch;
        a second end coupled to the $n^{th}$ DUT; and
        a control end coupled to a second switching signal;
    an $n^{th}$ compensation circuit among the first through the $N^{th}$ compensation circuits is configured to provide $n^{th}$ compensation current for reducing leakage current of the $n^{th}$ switching circuit when the $n^{th}$ DUT is not being tested; and
    n is an integer between 1 and N.

7. The test system of claim 6, wherein the $n^{th}$ switching circuit further comprises:
a third switch including:
  a first end coupled to a second test pad;
  a second end coupled to the second end of the second switch; and
  a control end coupled to a third switching signal.

8. The test system of claim 6, wherein the $n^{th}$ compensation circuit comprises a fourth switch which includes:
a first end coupled to a third test pad;
a second end coupled to the second end of the first switch and the first end of the second switch; and
a control end coupled to a fourth switching signal.

9. The test system of claim 6, wherein:
the $n^{th}$ DUT, the first switch and the second switch are transistors;
the first switch and the second switch have a first doping type; and
the $n^{th}$ DUT has a second doping type which is different from the first doping type.

* * * * *